United States Patent
Min et al.

Patent Number: 5,827,754
Date of Patent: Oct. 27, 1998

[54] FABRICATION METHOD FOR HIGH-OUTPUT QUANTUM WIRE ARRAY DIODE STRUCTURE

[75] Inventors: Suk-Ki Min; Eun Kyu Kim, both of Seoul, Rep. of Korea

[73] Assignee: Korea Institute of Science and Technology, Seoul, Rep. of Korea

[21] Appl. No.: 770,957

[22] Filed: Dec. 20, 1996

[30] Foreign Application Priority Data

May 22, 1996 [KR] Rep. of Korea .................. 1996-17439

[51] Int. Cl.$^6$ .................................................. H01L 21/00
[52] U.S. Cl. ............................... 438/40; 438/41; 438/43; 438/44
[58] Field of Search .............. 437/129; 372/45; 438/42, 43, 44, 39, 40, 41

[56] References Cited

U.S. PATENT DOCUMENTS

| | | | |
|---|---|---|---|
| 4,851,886 | 7/1989 | Lee et al. | 357/4 |
| 4,983,540 | 1/1991 | Yamaguchi et al. | 437/110 |
| 5,138,625 | 8/1992 | Paoli et al. | 372/45 |
| 5,160,492 | 11/1992 | Wang et al. | 437/129 |
| 5,296,719 | 3/1994 | Hirai et al. | 257/14 |
| 5,436,194 | 7/1995 | Kondo et al. | 437/129 |

OTHER PUBLICATIONS

Y. Qian et al., "Electronics Letters", Jan. 19, 1995, vol. 31, No. 2, pp. 102–1995.

E. Kapon et al., "Appl. Phys. Lett." 60 (4), Jan. 27, 1992, pp. 477–479.

S. Tsukamoto et al., "J. Appl. Phys" 71(1), Jan. 1, 1992, pp. 533–535.

Tae Geun Kim et al., "Appl. Phys. Lett." 69(7), Aug. 12, 1996, pp. 955–956.

*Primary Examiner*—Brian Dutton
*Attorney, Agent, or Firm*—Darby & Darby

[57] ABSTRACT

A fabrication method for a high output quantum wire array laser diode structure having a low threshold current and a high output is formed by fabricating a short period GaAs quantum wire array and removing an unnecessary quantum well layer with laser holographic lithography techniques and a metalorganic chemical vapor deposition and by forming a current blocking layer which is required in fabricating a laser diode with lithography techniques using a photoresist mask on a micro-patterned structure.

11 Claims, 4 Drawing Sheets

FABRICATION METHOD FOR HIGH-OUTPUT QUANTUM WIRE ARRAY DIODE STRUCTURE

BACKGROUND OF THE INVENTION

1. Field of the Invention

The present invention relates to a fabrication method for a high output quantum wire array laser diode structure, and in particular, to an improved high output quantum wire array laser diode structure used for producing a laser diode having a low threshold current and capable of high output, by forming a quantum wire array structure composed of AlGaAs/GaAs onto a GaAs substrate on which a short period V-grooved array is formed by laser holographic lithography and wet-etching, and by removing an unnecessary quantum well layers and forming a current blocking layer for allowing current to flow only to the quantum wire during laser oscillation.

2. Description of the Prior Art

Low dimensional semiconductor structures such as quantum wires or quantum dots have enhanced quantum bound effect which result in excellent electrical and optical characteristics in comparison with those semiconductor devices having no quantum type structures or structures having quantum wells.

When such structures are adopted to a laser diode, it is anticipated that advantages such as a low threshold voltage current, a high differential gain, a large bandwidth, a high characteristic temperature and a high non-linear gain effect would be obtained.

However, carriers in an active layer must be confined not merely vertically (that is, in one dimension) but horizontally and vertically (that is, in two or three dimension) with a crystalline surface in order to fabricate a structure of a perfect quantum wire or quantum dot structure, which actually causes much difficulty in processing techniques.

Two methods for the formation of a quantum wire structure have been known thus far.

In one method, after the formation of a quantum well structure, lines are defined and etched at intervals of tens of nm with electron beams or X rays to confine the carriers horizontally. But, the quantum wires formed by this method have many irregularities formed on the surface, which causes the quantum efficiency to be greatly reduced.

In another method, the quantum wires are formed during the growth of an epitaxial layer, for example, during the growth of an epitaxial layer on a vicinal substrate, during selective growth of an epitaxial layer and during the growth of an epitaxial layer on a micro-patterned substrate. Recently, many studies have been conducted on these methods because they do not require micro-patterned technology such as electron beam lithography and minimizes the externally exposed surface area to achieve a high quantum efficiency. These methods have many merits, such as the size and shape of a quantum wire grown on a patterned substrate by metalorganic chemical vapor deposition (MOCVD) can be easily controlled by changing the substrate direction or a specific growth condition, and an increase in temperature brings about the effect that carriers are implanted from a neighboring quantum well to a quantum wire region which is advantageous for laser diode operation under room temperature.

However, because of its small active layer, there are limitations in applying a quantum wire structure formed on such patterned substrate to a high output laser diode.

Accordingly, by applying a short period quantum wire array structure to fabricate a high output quantum wire laser diode, a light coupling effect between the neighboring quantum wires is generated, resulting in the fabrication of a high output laser diode having a low current density.

But, when using a short period quantum wire array, a current blocking layer which is required in the fabrication of a laser diode is difficult to form by conventional lithography techniques because the quantum wires are formed at intervals which are smaller than the unit of micrometers ($\mu$m).

SUMMARY OF THE INVENTION

Accordingly, it is an object of the present invention to provide an improved fabrication method for a high output quantum wire array laser diode structure having a low threshold current and a high output by fabricating a short period GaAs quantum wire array by employing laser holographic lithography technology and a metalorganic chemical vapor deposition, removing an unnecessary quantum well layer and by forming a current cut-off layer which is required in fabricating a laser diode with a lithography technology of using a photoresist mask on a micro-patterned structure.

To achieve the above object, there is provided an improved fabrication method for a high output quantum wire array laser diode structure which includes forming a short period quantum wire array on a substrate, removing a quantum well layer positioned on both sides of the short period quantum wire array by forming a photoresist mask, and forming a current blocking layer.

BRIEF DESCRIPTION OF THE DRAWINGS

The present invention will become more fully understood from the detailed description given hereinbelow and the accompanying drawings which are given by way of illustration only, and thus are not limitative of the present invention, wherein:

FIGS. 1A and 1B are cross-sectional views showing a quantum wire (QWR) array according to the conventional art, wherein FIG. 1A is a photograph taken through a scanning electron microscope(SEM) of a cross-sectional view of a quantum wire array and FIG. 1B is a cross-sectional diagram of a quantum wire array;

FIGS. 2A and 2B are cross-sectional views (QWR) showing a quantum wire array according to the present invention, wherein FIG. 2A is a cross-sectional view of a quantum wire (QWR) array and FIG. 2B is a photograph taken through an SEM of a cross-sectional view of a quantum wire (QWR) array;

DETAILED DESCRIPTION OF THE PREFERRED EMBODIMENTS

With reference to the accompanying drawings, the present invention will now be described in detail.

First, on a semi-insulated GaAs substrate with the direction of [100], a short period V groove having a period of about 700 nm and a depth of 350 nm is formed, and then a heterojunction structure of AlGaAs/GaAs is grown by metalorganic chemical vapor deposition (MOCVD) to fabricate a short period quantum wire array.

Figure 1A:
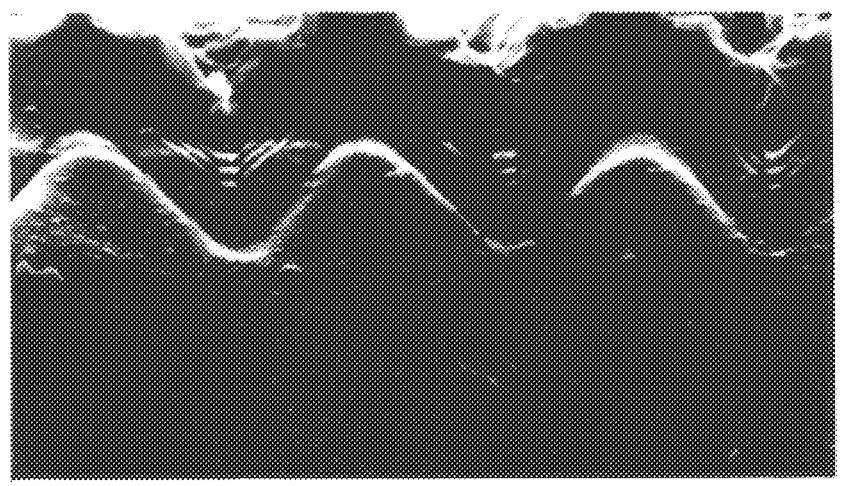
Figure 4:
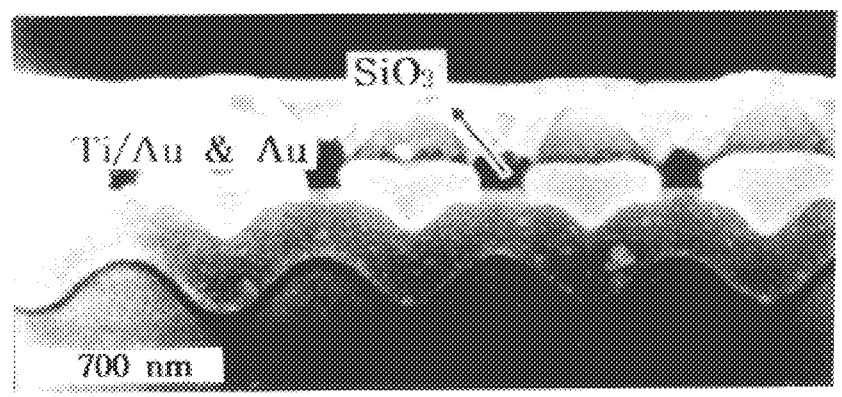
FIG. 4 is a cross-sectional view through an SEM of a quantum wire array laser diode structure in which a current blocking layer is formed and an electrode metal layer is deposited according to the present invention.
Figure 1B:
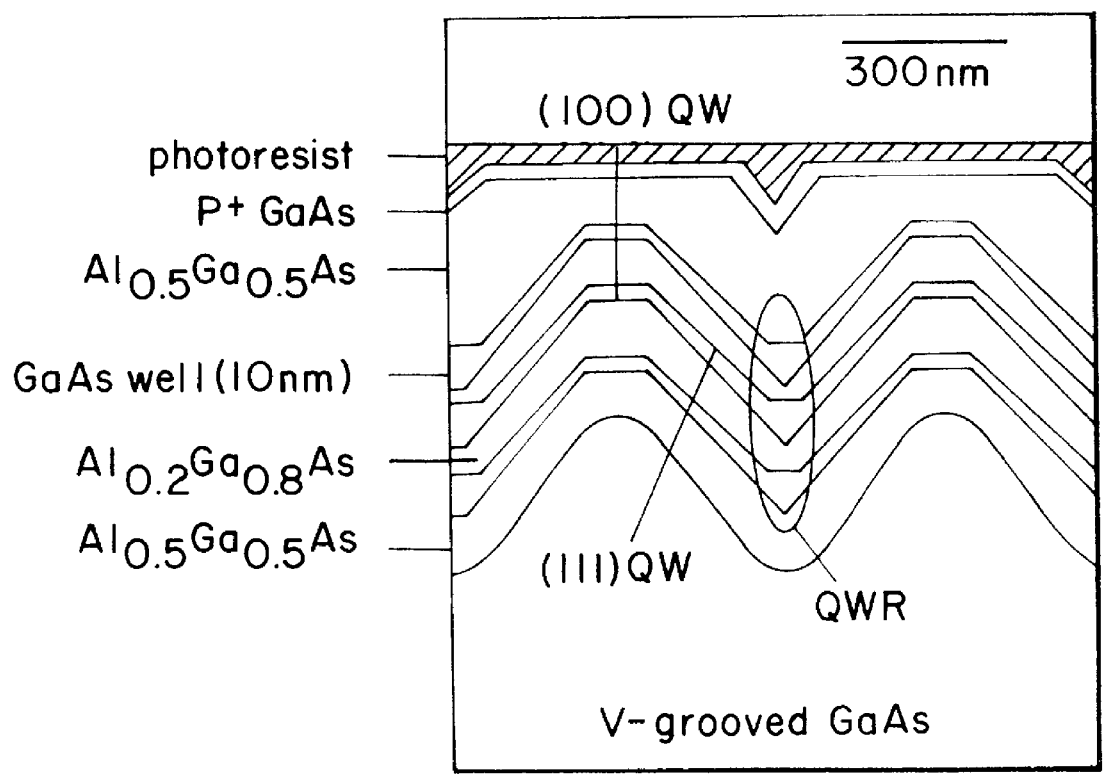

FIG. 1A is a photograph through a scanning electron microscope(SEM) of a cross-sectional view of a quantum wire array and FIG. 1B is a cross-sectional diagram of a quantum wire array to which a photo resist mask has been applied to make the improved device of the invention.

Figure 2A:
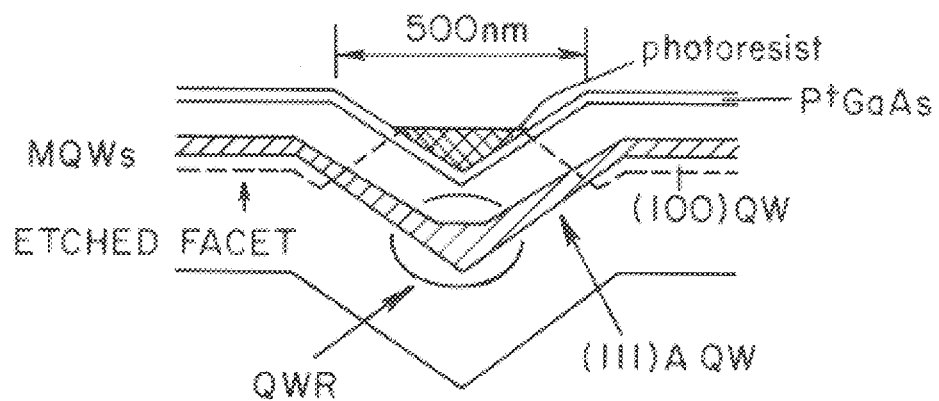
Figure 2B:
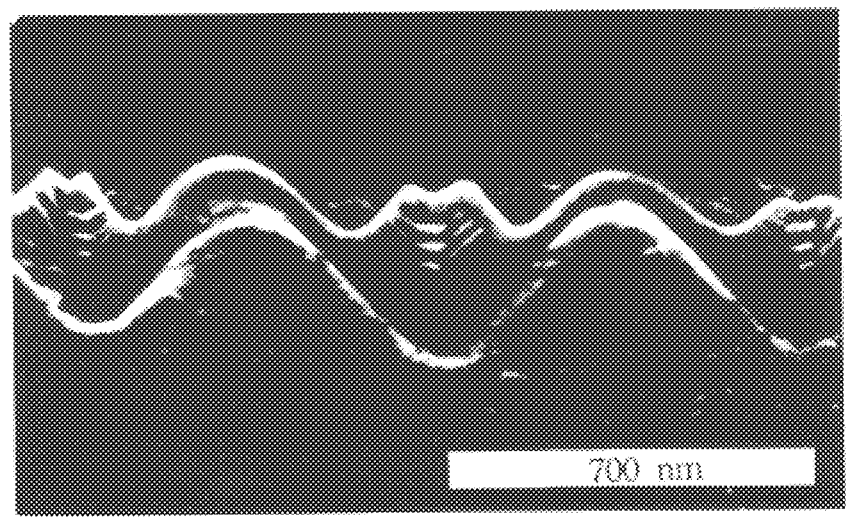

After the fabrication of the correction short period quantum wire array, in accordance with the present invention a photoresist mask is formed in a manner such that an AZ1505 photoresist is applied on a sample of the quantum wire array shown in FIG. 1B, the lattice-shaped upper surface is planarized, and then the entire surface is exposed to light and a development technique is employed so that the photoresist remains on the valleys formed on the upper surface of the sample, as shown in FIG. 2B.

In doing so, as shown in FIG. 2 the remaining photoresist portions are exactly on top of the quantum wires to serve as a mask for protecting the quantum wires, and the thusly-formed mask makes it possible to remove the unnecessary multi quantum well layer (MQW).

The removing of the multi quantum well layer (MQW) is performed at 20° C. in a mixed solution of $16H_3PO_4:9H_2O_2:75H_2O$, and by removing the portions above the dotted lines shown in FIG. 2A, all the multiquantum well layers (MQW) except the multiquantum wire (QWR) region are removed. FIG. 2B shows an SEM photograph of a cross-section of the sample after the multi quantum well layer (MQW) are removed.

Figure 3:
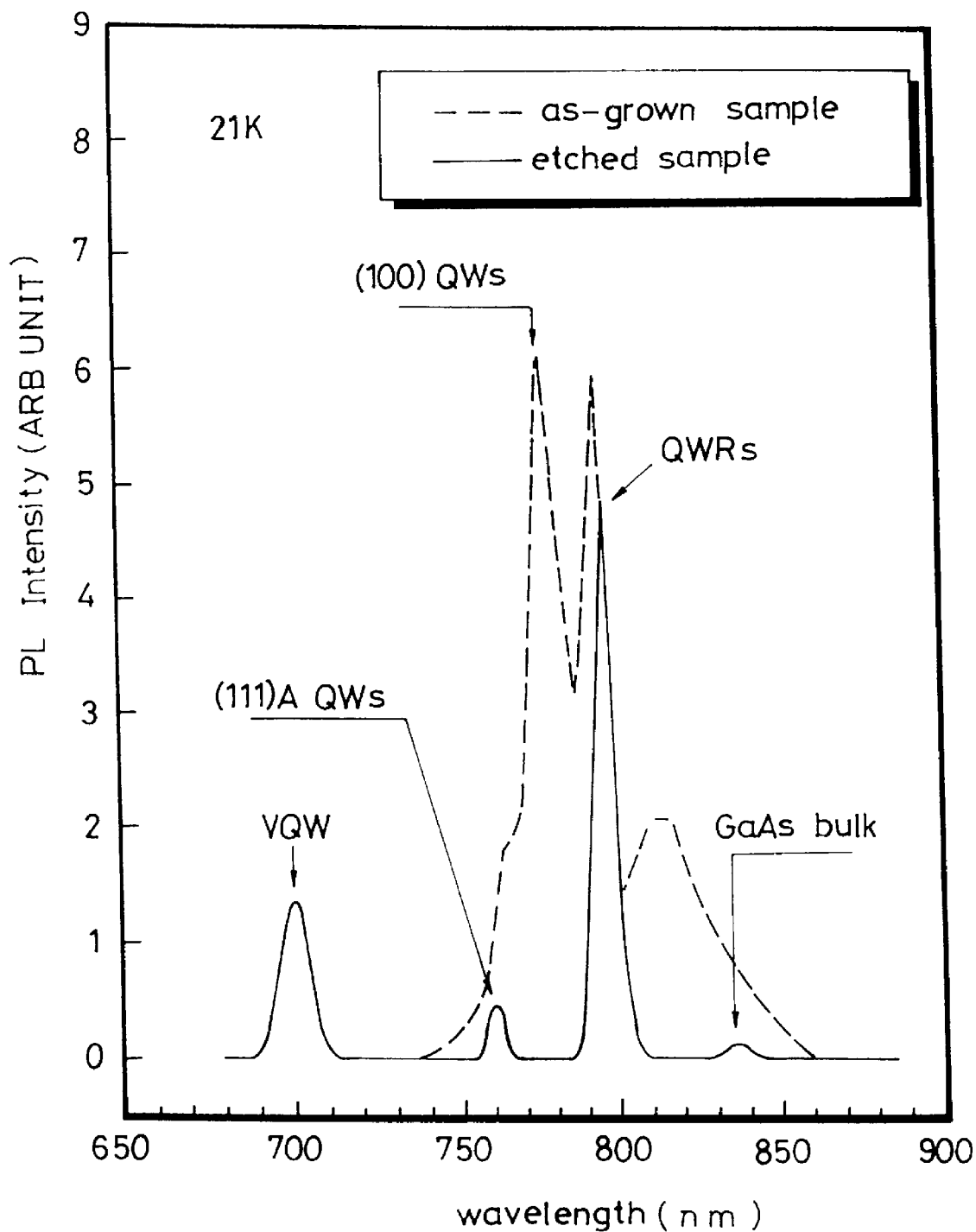
FIG. 3 is a characteristic graph showing a light filter luminescent spectrum after the removing of a quantum well layer.

FIG. 3 shows the characteristics of a light filter luminescent spectrum when the sample is measured at the temperature of 21K before and after the quantum well layers (QWS) are etched and removed.

As shown in this drawing, a signal of the [100] quantum well layer (QWS) observed in the pre-etched sample is not seen at all after etching.

Meanwhile, a relatively large signal around about 698 nm in the after-etched sample is observed, and this is caused by a vertical quantum well (VQW) layer formed on a latticed pattern during the growth of the quantum wires.

A signal from the quantum wires (QWRs) observed around 798 nm before etching is still observed to be large after etching, from which it can be seen that the short period quantum wire array structure is suitable for the fabrication of a high output laser diode.

After the quantum well layers (QWs) are removed, a small portion of the photoresist mask remains on the upper surface of the quantum wire array sample and it is used to form a current blocking layer In addition, the thusly-formed mask for removing MQWs is used to remove an unnecessary part of the highly doped P-type GaAs layer except for an ohmic contact layer formed on the upper portion of an active layer of the quantum wire (FIG. 2A).

Then, a current blocking layer composed of a silicon oxide film ($SiO_2$) for improving the introduction of current to the active layer of the quantum wire by allowing a current to flow only to the quantum wire during laser operation, is formed by depositing a silicon oxide film ($SiO_2$) employing a plasma enhanced chemical vapor deposition (PECVD) and employing a lift off process thereafter.

Finally, an electrode is formed by depositing titanium-gold (Ti/Au) and gold (Au) by means of electron beam deposition.

As described in detail above, an improved fabrication method for a high output quantum wire array laser diode structure having a low threshold current and a high output can be achieved by fabricating a short period GaAs quantum wire array, removing an unnecessary quantum well layer with laser holographic lithography techniques and metalorganic chemical vapor deposition, and by forming a current blocking layer which is required in fabricating a laser diode using lithography techniques of employing a photoresist mask on a micro-patterned structure.

Although the preferred embodiments of the present invention have been disclosed for illustrative purposes, those skilled in the art will appreciate that various modifications, additions and substitutions are possible, without departing from the scope and spirit of the invention as recited in the accompanying claims.

What is claimed is:

1. A fabrication method for forming a high output quantum wire array laser diode structure, comprising:

forming a short period quantum wire array on a substrate;

removing a quantum well layer positioned on both sides of said short period quantum wire array; and forming a current blocking layer.

2. The method of claim 1, wherein the forming of said short period quantum wire array includes forming a short period V-grooved array substrate having a period which is smaller than one (1) micrometer by laser holographic lithography techniques on said substrate.

3. The method of claim 1, wherein said quantum wire array is grown by metalorganic chemical vapor deposition.

4. The method of claim 1, wherein the removing of said quantum well layer is performed by a wet etching process using a photoresist mask.

5. The method of claim 4, wherein a solution of $H_3PO_4$, $H_2O_2$ and $H_2O$ mixed in a ration of 16:9:75 is used in the wet etching process for removing of said quantum well layer.

6. The method of claim 1, wherein said current blocking layer is formed by plasma en- hanced chemical vapor deposition using a silicon oxide film ($SiO_2$).

7. The method of claim 6, wherein the silicon oxide film ($SiO_2$) in the quantum wire region is removed by a lift off process.

8. A method as in claim 1 wherein said current blocking layer is of $SiO_2$.

9. A method as in claim 1 wherein said wire array comprises a plurality of V-shaped grooves.

10. A fabrication method for forming a high output quantum wire array laser diode structure, comprising:

forming on a substrate a quantum wire array of a plurality of parallel short period V-grooves each having a quantum wire and at least one quantum well over said quantum wire;

removing any said quantum well on horizontal portions on both sides of said V-grooves substantially down to said quantum wire; and forming a layer of a current blocking material on said horizontal portions and the diagonal sides of said V-grooves substantially down to said quantum wire.

11. A fabrication method as in claim 10, wherein said current blocking layer is formed by depositing a layer of $SiO_2$ and then lifting off said $SiO_2$ layer.

* * * * *